United States Patent
Maeda

(10) Patent No.: US 7,086,822 B2
(45) Date of Patent: Aug. 8, 2006

(54) SCALAR TYPE ROBOT FOR CARRYING FLAT PLATE-LIKE OBJECT, AND FLAT PLATE-LIKE OBJECT PROCESSING SYSTEM

(75) Inventor: Akira Maeda, Hiroshima (JP)

(73) Assignee: RORZE Corporation, Hiroshima (JP)

( * ) Notice: Subject to any disclaimer, the term of this patent is extended or adjusted under 35 U.S.C. 154(b) by 0 days.

(21) Appl. No.: 10/497,702

(22) PCT Filed: Dec. 2, 2002

(86) PCT No.: PCT/JP02/12596
§ 371 (c)(1),
(2), (4) Date: Nov. 24, 2004

(87) PCT Pub. No.: WO03/047820
PCT Pub. Date: Jun. 12, 2003

(65) Prior Publication Data
US 2005/0079042 A1     Apr. 14, 2005

(30) Foreign Application Priority Data
Dec. 4, 2001   (JP) .............................. 2001-370626

(51) Int. Cl.
*B25J 17/02* (2006.01)
(52) U.S. Cl. .................. 414/744.5; 901/15; 901/29
(58) Field of Classification Search ............. 414/744.5, 414/918; 901/11, 12, 13, 15, 27, 28, 29; 74/490.01, 490.02, 490.05, 490.06
See application file for complete search history.

(56) References Cited

U.S. PATENT DOCUMENTS 3,012,447 A * 12/1961 Wallace ...................... 74/526
5,839,322 A    11/1998 Genov et al.
6,065,364 A *  5/2000 Shiraki et al. ............ 74/490.01
6,121,743 A    9/2000 Genov et al.
6,234,738 B1 *  5/2001 Kimata et al. .............. 414/416
6,326,755 B1 * 12/2001 Babbs et al. ........... 318/568.21

FOREIGN PATENT DOCUMENTS

| JP | 9-205127 | * | 8/1997 |
| JP | 11-284049 | | 10/1999 |
| JP | 2000-183128 | | 6/2000 |

* cited by examiner

Primary Examiner—Donald W. Underwood
(74) Attorney, Agent, or Firm—Dickstein Shapiro Morin & Oshinsky LLP

(57) ABSTRACT

An SCARA type robot comprises: an arm unit (14), whose one end is linked to a base (11) so as to be pivotable in a horizontal plane, and which is capable of horizontally bending and stretching; wrist portions (15a, 15b) which are linked to the other end of the arm unit so as to be pivotable in a horizontal plane, and to which finger portions (16a, 16b) to hold a tabular object (7) are fixed; and a driving means for the arm unit and the wrist portions, wherein the driving means can independently turn a pivotable portion which links the wrist portions and the arm unit, a pivotable portion which bends and stretches the arm unit, and a pivotable portion which links the arm unit and the base, so that the finger portions holding the tabular object can be moved along a plurality of nearly straight through routes which are virtually parallel to each other, and can cause at least one of the pivotable portions to make one turn or more. The SCARA type robot further comprises stoppers (21a, 21b) which limit the turn of the pivotable portions capable of making one turn or more to a prescribed pivotable angle after one turn is made. By this constitution, it is made possible to move the finger portions which are fixed to the wrist portions and hold the tabular object in the nearly vertical direction in relation to a front entrance of a target instrument, and to prevent a wiring and piping in the body and the arms from being twisted off due to the excessive turning.

3 Claims, 14 Drawing Sheets

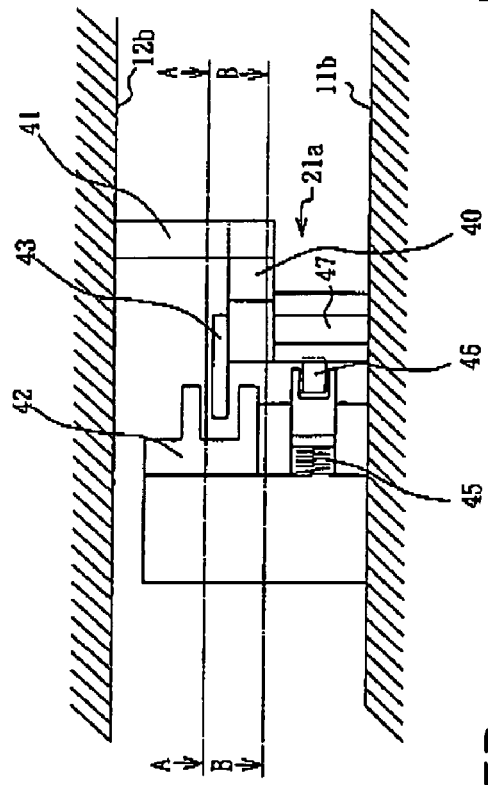
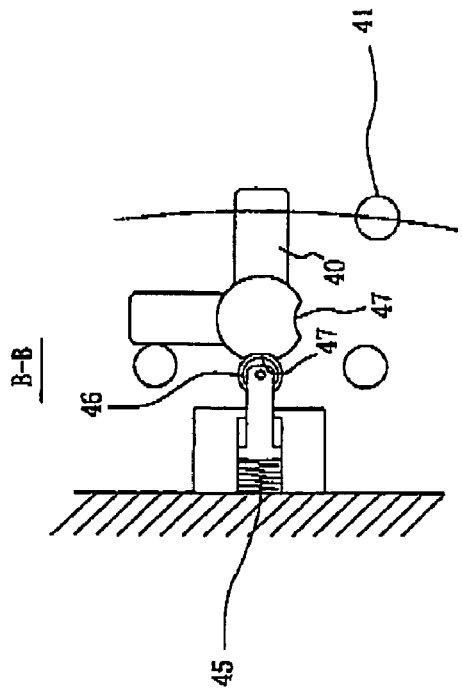
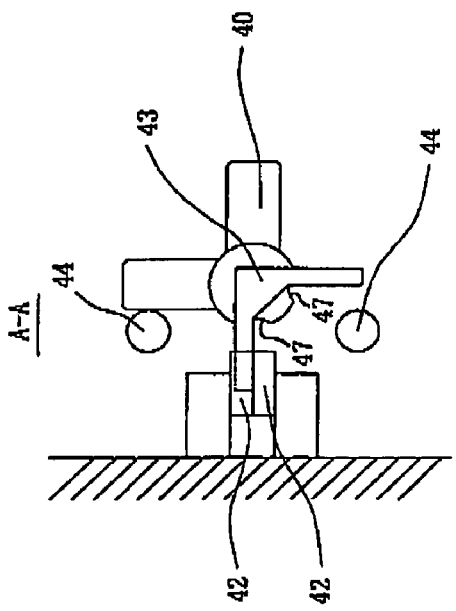

C-C

D-D

E-E

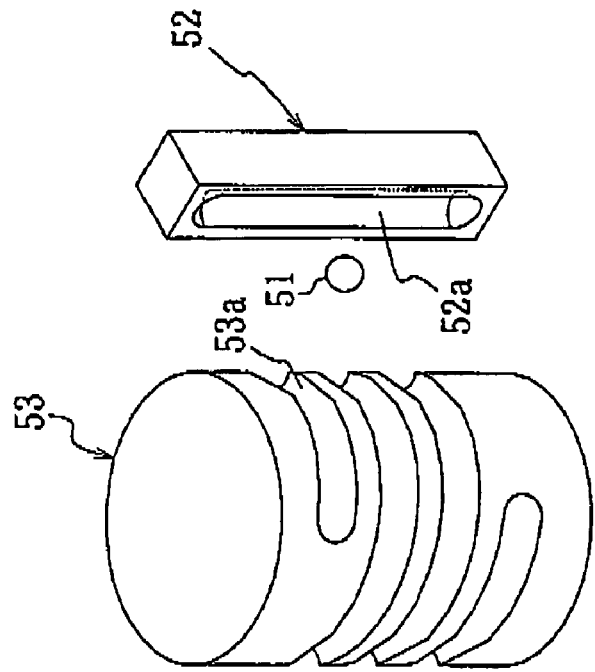
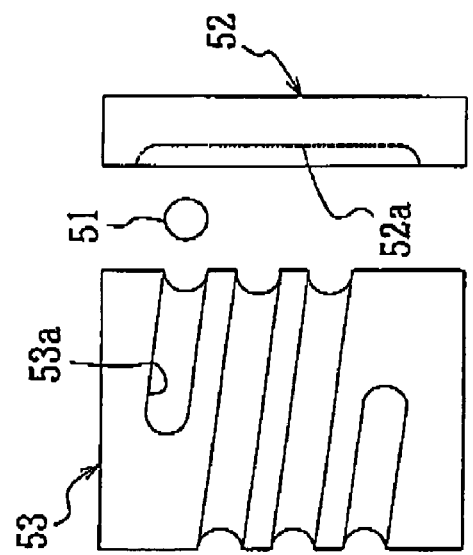
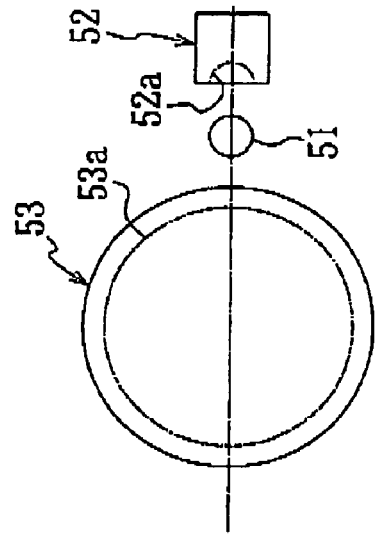

SCALAR TYPE ROBOT FOR CARRYING FLAT PLATE-LIKE OBJECT, AND FLAT PLATE-LIKE OBJECT PROCESSING SYSTEM

TECHNICAL FIELD

The present invention relates to an SCARA type robot to carry a tabular object, and more particularly to a robot used to transfer and convey a tabular object such as a semiconductor wafer, a transparent substrate for liquid crystal display panel, and a print circuit board.

The invention also relates to a processing system for a tubular object in which the SCARA type robot is incorporated.

BACKGROUND ART

SCARA type robots are generally used to take out semiconductor wafers or liquid crystal substrates from carriage cassettes and hand them over to various processing devices, and to subsequently transfer them to the ensuing process, e.g. to taken them back to the carriage cassettes after the processes by the processing devices. The SCARA type is an abbreviation derived from initial letters of Selective Compliance Assembly Robot Arm. In SCARA type robots, the bending and stretching of the arm unit as well as the horizontal movement of the fingers are realized by turning of each arm in the horizontal plane. SCARA type robots are often used in an anti-dust environment. In the initial phase, a robot comprising one arm unit, linked to the body, to linearly move a finger was used.

Later, in order to improve the efficiency of transferring wafers etc., for example, as shown in Japanese Patent No. 273941, another mode of SCARA type robot has been developed, wherein two arm units are installed in the pivotable body, and which carries wafers and the like twice as efficiently by alternately and linearly moving two fingers in the same direction in both arm units.

In addition, in Japanese Unexamined Patent Application Publication No. H11-163090, as shown in FIG. 14, yet another mode of SCARA robot has been suggested, whose arm unit 14, although single, comprises three arms, and wherein two finger portions 16 located at a tip portion of the arm unit, arranged at an angle of 120 degrees in-between, are fixed to one wrist portion 15. By this, operations such as an operation of causing one finger portion 16 to transfer the unprocessed wafer while causing the other finger portion to receive the fabricated and processed wafer has been made possible, and accordingly the efficiency of the transferring is improved. In addition, since the arm unit 14 comprises the three arms, there is an advantage that the finger portion 16 is caused to reach farther.

However, the former of the foregoing conventional SCARA type robots is constructed in a way that the two arm units cause the two fingers to move linearly in the same direction. For this reason, when carrying the wafer to, and from, target instruments such as a wafer processing instrument and a wafer cassette, the robot has to be located in front of the target instrument. When target instruments such as a wafer cassette and a processing instrument are arranged in a line in the lateral direction, the robot itself has to be moved in the lateral direction by providing a track along the line of these instruments. When the track was constructed, the construction entailed costs, but also required the area of a place where the robot can be moved and operated to be larger. Accordingly, the area used for this inside the expensive clean room was required to be larger, and this was what was not preferable.

In this regard, as in the case of the latter conventional example shown in FIG. 14, in order to reduce costs and improve the efficiency of the transferring, an SCARA type robot having a wrist portion to which the two fingers are fixed in the tip portion of the single arm unit has been suggested. In such a conventional robot, the combination of the pivotable wrist portion and the arm unit capable of linearly moving the wrist portion has made it possible to freely carry the wafer to, or from, the target instrument diagonally in the front thereof, without moving the robot itself in the lateral direction (in the x axis direction). However, since the two fingers are integrally installed in the single wrist portion, an area where the wrist portion is turned while holding two wafers is required in front of the target instrument. In addition, in the case that an entrance towards the target instrument is narrow, there are disadvantages, for example, such as a disadvantage that the other finger hiders the delivering of the wafer to the target instrument.

Further, in the latter conventional example, a heavy motor which drives to turn the wrist portion to which the two fingers are installed is arranged in the tip portion of the arm unit. In addition, the arm unit is long since the arm unit comprises the three arms. Consequently, each arm needs to be made thick due to the necessity of maintaining the rigidity, the force of inertia while moving the arm unit is large, and a larger power for driving the arm unit is necessary. In addition, it is difficult to precisely conduct positioning when the arm unit is stopped.

Furthermore, in the latter conventional example, there is no stopper to limit pivotal angles of the arm unit and the wrist portion. It is likely, therefore, that electric wiring to the motor and sensor installed to the wrist portion, vacuum piping to the suction holes of the finger tip and the like may be excessively wrenched and twisted off. If the turning portions are intended to be provided with a known stopper comprising a stopper pin and a stop face, the turning angles are limited to only less than 360 degrees (one turn). Therefore, a disadvantage would arise that operations which require significantly different directions, for example, such as handing over in front of the robot and handing over in the rear of the robot cannot be conducted continuously.

DISCLOSURE OF THE INVENTION

As the result of close examination for resolving the problems of conventional SCARA type robots as above described, inventors of this application have developed an SCARA type robot to carry a tabular object, comprising: a base; an arm unit configured to have two arms, one end of the arm unit being linked to the base so as to be pivotable in a horizontal plane, and the arm unit being capable of horizontally bending and stretching; wrist portions, which are linked to the other end of the arm unit so as to be pivotable in a horizontal plane, and to which finger portions to hold a tabular object are fixed; and a driving means for the arm unit and the wrist portions, wherein the driving means can independently turn a pivotable portion which links the wrist portions and the arm unit, a pivotable portion which bends and stretches the arm unit, and a pivotable portion which links the arm unit and the base, so that the finger portions can be moved along a plurality of nearly straight through routes which are virtually parallel to each other, and the driving means can cause at least one of the pivotable portions to make one turn or more. The SCARA type robot of the present invention further comprises stoppers which limit the turns of the pivotable portions capable of making one turn or more to a prescribed pivotable angle after one turn is made.

It is possible that this SCARA type robot of the invention comprises the two wrist portions and these wrist portions are turnable independently from each other and arranged on the same turning axis line as each other. It is also possible that the driving means for the wrist portions are incorporated in a part between both ends of the arm of the two arms of the arm unit, to which the wrist portions are linked.

According to the SCARA type robot of the invention, the driving means can independently turn the turning part which links the wrist portions and the arm unit, the turning part which bends and stretches the arm unit, and the turning part which links the arm unit and the base, so that the finger portions can be moved along the plurality of approximately straight through routes which are approximately parallel to each other, and can turn at least one of the turning parts one or more revolutions. Therefore, by combining turning movements of the turning part which bends and stretches the arm unit (joint part) and the respective turning parts which link the arm unit to the base and wrist portions, the finger portions which are fixed on the wrist portions and hold the tabular object can be moved in the approximately vertical direction in relation to the front entrance of a target instrument such as a container housing the tabular object, a machine to fabricate, process, inspect the tabular object, and a machine to conduct positioning of the tabular object.

It is enough that the finger portion on which the tabular object is laid is linearly moved in the vertical direction in relation to the front entrance or approximately linearly moved in the approximately vertical direction while the finger portion is turned so that the finger portion draws an arc so as to prevent the tabular object from touching the lateral face of the target instrument. The finger portions on which the tabular object is not laid can be inserted or taken out in or from the target instrument in the oblique direction in relation to the front entrance.

Further, according to the SCARA type robot of the invention, stoppers which can turn at least one of the turning parts one or more revolutions, and which limit the turning of the turning parts capable of turning one or more revolutions to a given turning angle of one or more revolutions are provided. Therefore, angle correction pooled between respective operations such as receiving the wafer from a clean container, handing over/receiving the wafer to/from the wafer positioning device, handing over/receiving the wafer to/from the wafer processing device, and handing over the wafer to the clean container after processing can be conducted after a series of operations. Particularly, it is advantageous when a plurality of finger portions deals with a plurality of wafers continuously. For such angle correction, it is desirable that turning is allowed close to two revolutions. It is more desirable that turning is allowed three revolutions. It is enough that the stoppers allow up to four revolutions to be on the safe side.

In the invention, it is possible that a body on which one end of an arm unit is fixed is supported by a base, and a driving part which turns the body in relation to the base and a driving part which moves the body up and down (in the z axis direction) in relation to the base can be provided inside the body.

A motor used as a driving means can be any known motor such as a servo motor, a stepping motor, and a direct drive motor, as long as turning angle control can be conducted by a control device. As a measurement means for turning angle, an encoder is generally used. However, in the case of using the stepping motor, it is possible to omit the encoder if not necessary.

As a reduction structure to lower a turning speed of the motor, it is possible to use a known technique such as a belt type reducer combining pulleys and timing belts, an independent reducer having a rigid wheel gear inside, an epicycle reduction gear, an eccentric epicycle reduction gear, (product name: Harmonic Drive etc.), and a motor coupled with a reducer wherein the motor and a change gear share the same housing. In the case where two direct drive motors are directly linked to each other on the same axis line as the turning axis, it is not necessary to install the reducer.

In order to confirm presence and position of a tabular object to be carried and a target instrument to which the tabular object is carried, it is possible to provide a sensor at the finger portions or the wrist portions of the robot of the invention. As such a sensor, a known sensor such as a transmissive optical sensor and a reflective sensor can be used. The finger portion is not limited to the finger portion on which the tabular object is laid horizontally, but can be an edge clamp type finger which holds an end of the tabular object.

In a processing system for tabular object of the invention, the SCARA type robot of the invention is arranged adjacently to a carry-in/carry-out place for the tabular object and a processing device for the tabular object. According to such a processing system, the SCARA type robot can move the finger portions along a plurality of approximately linear routes approximately parallel to each other, that is, linear routes and almost linear arc routes. Therefore, it is not necessary that the robot is located in front of the target instrument such as a wafer processing device and a wafer cassette when carrying in/out the wafer to/from the target instrument. Consequently, even when the wafer cassette, the wafer processing device etc. are lining side by side, it is not necessary to move the robot body sidewise by providing a track along such a line. In result, it is possible to cut out the cost for providing the track. In addition, it becomes unnecessary to secure an area wherein the robot can be moved and operated, and the area the robot uses in an expensive clean room can be reduced.

BRIEF DESCRIPTION OF THE DRAWINGS

FIG. 5A is a lateral view showing an example of a stopper of the SCARA type robot of the foregoing example;

FIGS. 5B and 5C are cross sectional views taken along lines A—A and B—B of FIG. 5A;

FIG. 10A is an exploded lateral view showing other example of a stopper, which can be used instead of the foregoing stopper;

FIGS. 10B and 10C are an exploded plane view and an exploded oblique perspective view showing the stopper;

BEST MODE FOR CARRYING OUT THE INVENTION

Figure 1:
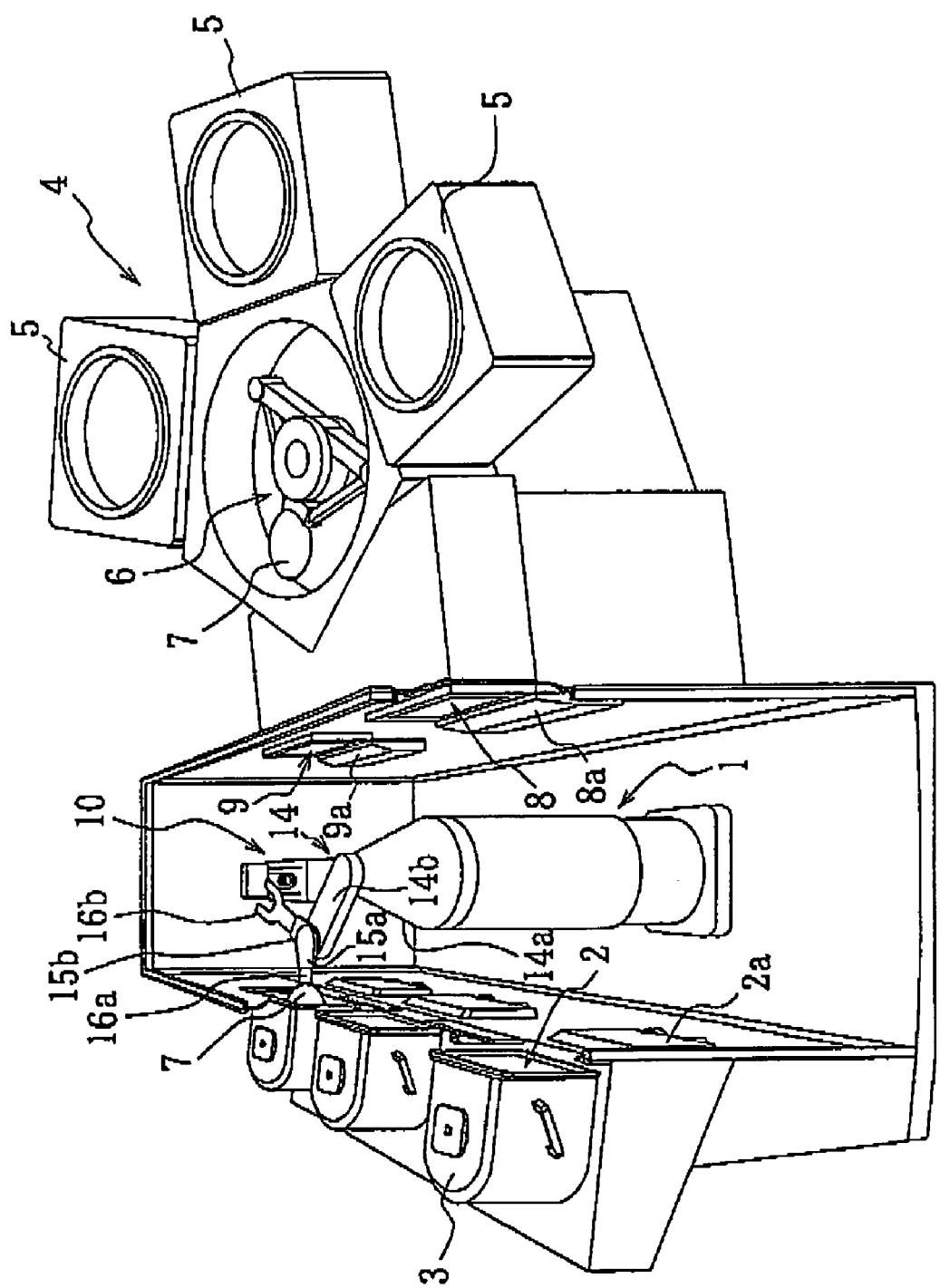
FIG. 1 is a partially cut-off oblique perspective view showing a wafer processing system as an example of a processing system for tabular object of the invention, in which an example of an SCARA type robot of the invention is arranged.

Detailed descriptions will be hereinafter given of an embodiment of the invention by taking an example based on the drawings. FIG. 1 is a segmentary oblique perspective figure, which shows a wafer processing system as an example of a processing system for tabular object of the invention, in which an example of an SCARA type robot of the invention is arranged. A room where an SCARA type robot 1 of the foregoing example is installed is provided with an unshown ceiling having a fan filter unit on the upper side, and an unshown wall on the near side. The room is thereby set to a high clean area. Load ports 2 on which a clean container 3 to house a wafer 7 is laid outside are installed at three places on the left side wall in FIG. 1 in the processing system of this example. Port doors 2a for the respective load ports 2 are open in this figure. A wafer positioning device 10 is installed against the rear wall.

Figure 2:
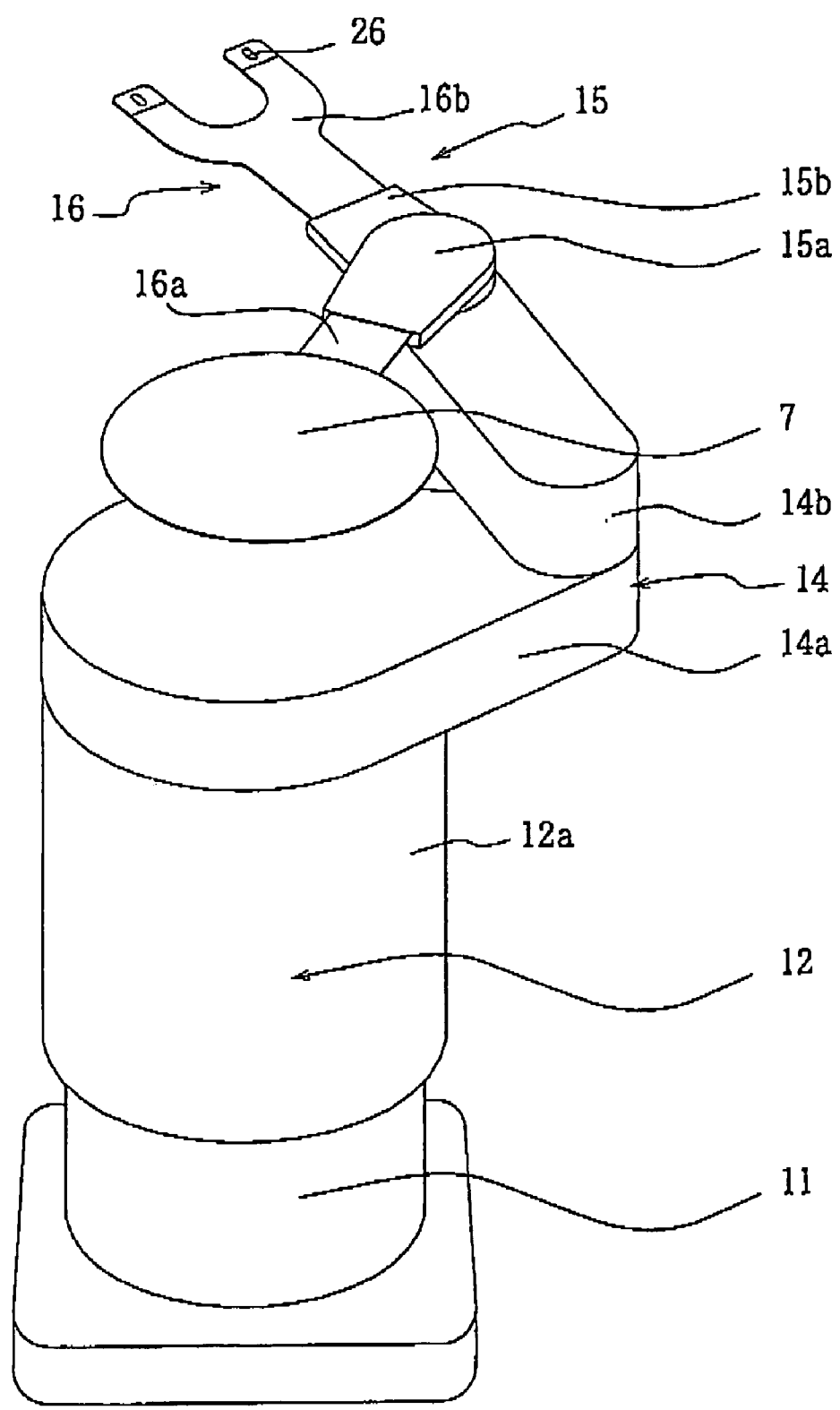
FIG. 2 is an oblique perspective view showing an appearance of the SCARA type robot of the foregoing example.

FIG. 2 is an oblique perspective figure, which shows an appearance of the SCARA type robot 1 of the foregoing example. This robot 1 comprises a body 12 on a base 11 fixed on the floor face so that the body 12 is turnable in relation to the base 11. The body 12 has a body cover 12a fixed on a first arm 14a of an arm unit 14 and a body frame 12b integrally connected with a rear anchor part of the first arm 14a. A rear anchor part of a second arm 14b of the arm unit 14 is connected turnable with an end of the first arm 14a. Two wrist portions 15a and 15b on which two upper and lower finger portions 16a and 16b are fixed are supported turnable on the same turning axis line as each other on an end of the second arm 14b. Therefore, in FIG. 1, among these finger portions, the lower finger portion 16b stands by for receiving the processed wafer 7, and the upper finger 16a is going to take out the unprocessed wafer 7 from the clean container 3 on the rear side.

In FIG. 1, a wafer processing device 4 having a plurality of wafer processing machines 5 is arranged on the right side of the right side wall. In FIG. 1, a carry-in window 8 and a carryout window 9 for the wafer 7 of the wafer processing device 4 are provided on the right side wall. Two doors 8a and 9a of these carry-in window 8 and carryout window 9 are open in the figure. In the shown wafer processing device 4, a carrier 6 stands by for receiving the wafer 7 processed by the wafer processing machine 5, and handing over the wafer 7 to the lower finger 16b of the robot 1 which is inserted through the carry-out window 9 on the rear right side. This wafer processing device 4 is attached with an unshown cover. High clean air is blown in the wafer processing device 4 from the foregoing fan filter unit through the carry-in window 9 and the carry-out window 8. Therefore inside of the wafer processing device 4 is set to a high clean area. It is possible to provide the wafer processing device 4 with other fan filter unit by making a construction so as to prevent air from flowing back into the robot 1 side.

Figure 3:
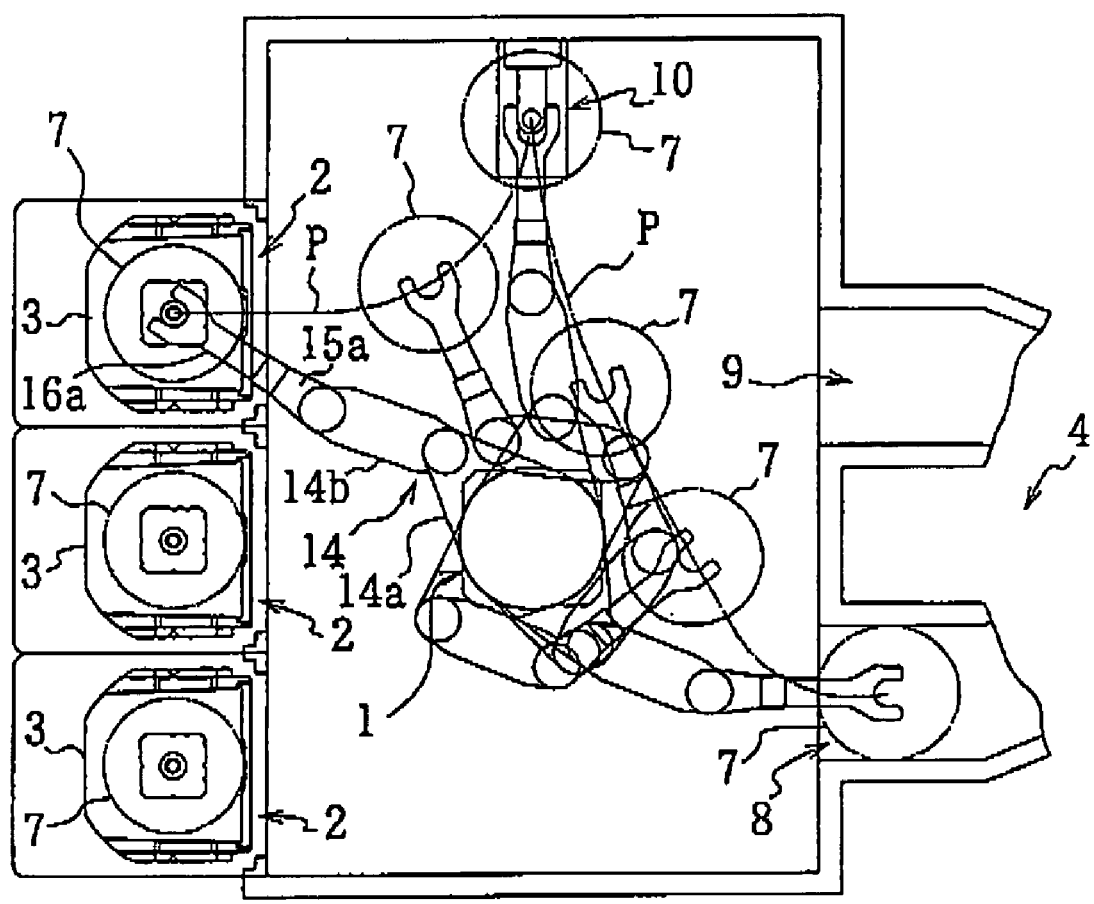
FIG. 3 is a plane view showing an operation example of an arm unit and an upper finger portion of the SCARA type robot of the foregoing example.

FIG. 3 is a plane view, which shows an operation example of the arm unit 14 and the upper finger portion 16a set to exclusive use for the wafer 7 e.g. before fabrication or processing of the SCARA type robot 1 of the foregoing example in a state that the lower finger portion 16b and the wrist portion 15b are omitted. As shown in FIG. 3, the upper finger portion 16a on which the wafer 7 is laid moves on a route P, a combination of a straight through route outlying in the vertical direction in relation to an entrance face of the clean container 3 linked to the load port 2 and a subsequent circular curve route. The lower finger portion, which is not illustrated, can be set to exclusive use for the wafer 7 e.g. after fabrication or processing. If set so, it becomes possible to still improve cleanliness of the wafer 7 before fabrication or processing in the processing device 4, and still improve precision of fabrication and processing. Though not shown in FIG. 3, it is necessary to make an operation program so that the upper finger portion 16a and the lower finger portion 16b are deviated from each other at an angle to prevent one from interfering with a target instrument during operation of the other when the upper finger portion 16a and the lower finger portion 16b respectively lay the wafer 7.

As shown in the foregoing operation example, the robot 1 of this example moves the finger portions 16a and 16b along the straight through route outlying in the vertical direction in relation to the entrance face of the clean container 3 also while the finger portions 16a and 16b are in any clean container 3. When the clean container 3 diagonally to the front of the robot 1 is a target instrument from or to which the wafer 7 is taken out or in, while a joint part of the wrist portions 15a and 15b and the arm unit 14, and the body 12 are turned as appropriate, the finger portions 16a and 16b, then the wafer 7 are moved along the straight through route perpendicular to the entrance face of the clean container 3 and the subsequent circular curve route. When the central clean container 3 is a target instrument from or to which the wafer 7 is taken out or in, it is enough that the wafer 7 is moved along the straight through route. As above, by combining as appropriate a plurality of straight through routes which are approximately parallel to each other and the circular curve route, the finger portions 16a and 16b operate with the goal of three positions on the front face side wherein the three clean containers 3 are laid and two positions on the rear face side wherein the carry-on window 8 and the carry-out window 9 of the wafer processing device 4 are provided.

The SCARA type robot of this invention can have only one finger portion differently from in the foregoing example. In this case, the foregoing finger portion operates according to two examples.

Figure 4:
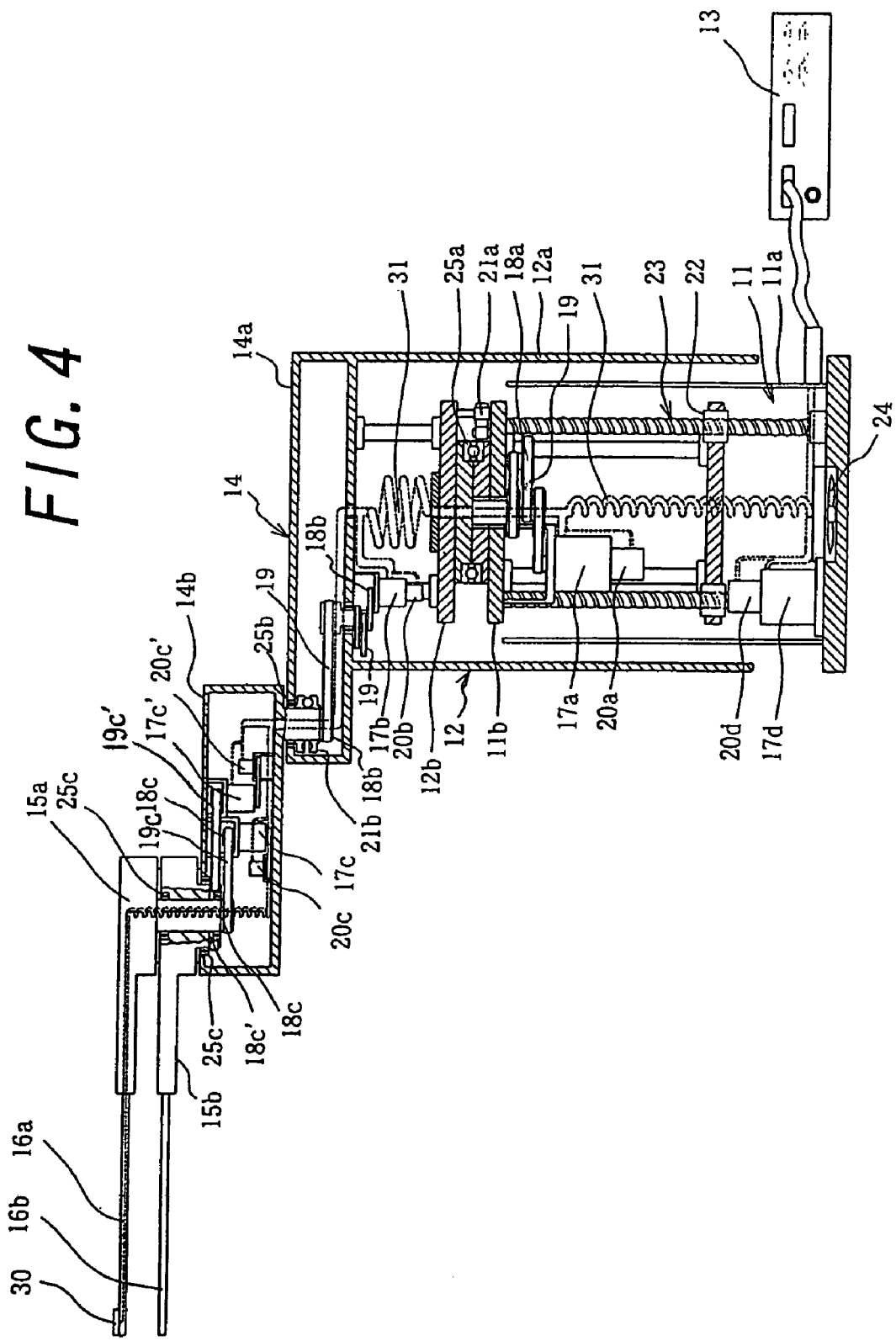
FIG. 4 is a longitudinal sectional view showing an internal structure of the SCARA type robot of the foregoing example.

FIG. 4 is a longitudinal sectional view, which shows an internal structure of the SCARA type robot 1 of the foregoing example shown in FIG. 3. Ball screws 23 provided on the base 11 is turned by being driven by a motor 17d which is fixed on the base 11 and on which an encoder 20*d* to detect the turning angle is provided. Then, ball nuts 22 which are screwed together with the ball screws 23 move up and down. The body 12 and all structures above the body 12 are moved up and down (in the z axis direction) through a lifting table 11*b* of the base 11, which is integrally connected with the ball nut 22. A signal showing the distance of such movement is output from the encoder 20*d*. A first arm driving motor 17*a* and an encoder 20*a* to detect the turning angle are fixed on the bottom face side of the lifting table 11*b* of the base 11. The motor 17*a* can turn the body 12 and the first arm 14*a* together in relation to the base 11 one revolution or more through a three-stage reduction transmission structure having a plurality of timing belts 19 and pulleys 18*a*.

A shaft center of a support shaft of the pulley, which is located in a central part of the body 12 is in a hollow state in order to let through a wiring 31. A roller bearing or a ball bearing 25*a* is incorporated, and a stopper 21*a* shown in FIGS. 5A, 5B, 5C, 6A, 6B, and 6C is installed between the body frame 12*b* with which the first arm 14*a* is integrally connected and the lifting table 11*b* of the base 11. When a turning angle of the first arm 14*a* in relation to the base 11 reaches close to two revolutions, the stopper 21*a* stops more turning and prevents the wiring 31 from over-twisting. Further, in order to take in clean air through between the body cover 12*a* and a base cover 11*a* and exhaust dusts near the body 12 and the base 11 along with air current, an exhaust fan 24 is provided at the bottom of the base 11.

Figure 6A:
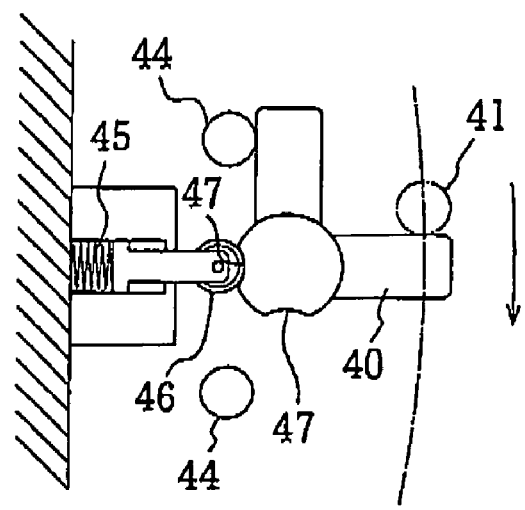
FIGS. 6A, 6B, and 6C are explanation drawings showing operation of the foregoing stopper.
Figure 6B:
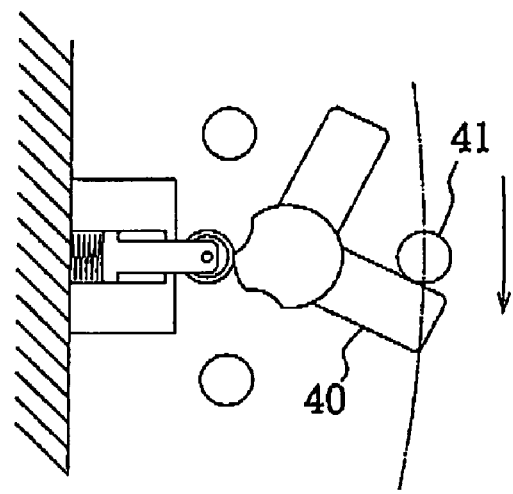
Figure 6C:
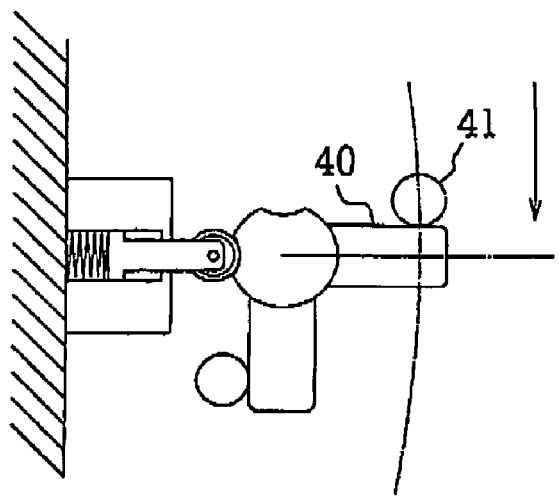

FIG. 5A is a lateral view showing the foregoing stopper 21*a*. FIGS. 5B and 5C are cross sectional views taken along lines A—A and B—B of FIG. 5A respectively. FIGS. 6A, 6B, and 6C are explanation drawings showing operation of the stopper 21*a*. This stopper 21*a* can stop turning of the body 12 in relation to the base 11 at an angle slightly less than two revolutions by combination of an L-shape stop member 40 capable of turning at an angle of 90 degrees and a stop pin 41 in this case. A turning position of the stop member 40 can be detected by checking which of two sensors 42 detects a sensor dog 43.

That is, in this stopper 21*a*, the L-shape stop member 40 which is supported turnable by arranging at a corner part of the L shape a support shaft having two grooves 47 in the axis line direction spaced at an angle of 90 degrees in the circumferential direction; and a stop roller 46 which holds the stop member 40 at the positions shown in FIGS. 6A and 6C by being encouraged by a spring 45 and engaging with the groove 47 in the axis line of the support shaft are installed above the lifting table 11*b*. The stop pin 41 is installed on the body frame 12*b* downward. As shown in FIG. 6A, when the stop pin 41 comes from inside the L-shape of the stop member 40, as shown in FIG. 6B, the stop member 40 is turned over and the body frame 12*b* is turned. As shown in FIG. 6C, when the body frame 12*b* turns one more, the stop pin 41 contacts with outside the L-shape of the stop member 41 and the body frame 12*b* stops.

Figure 7A:
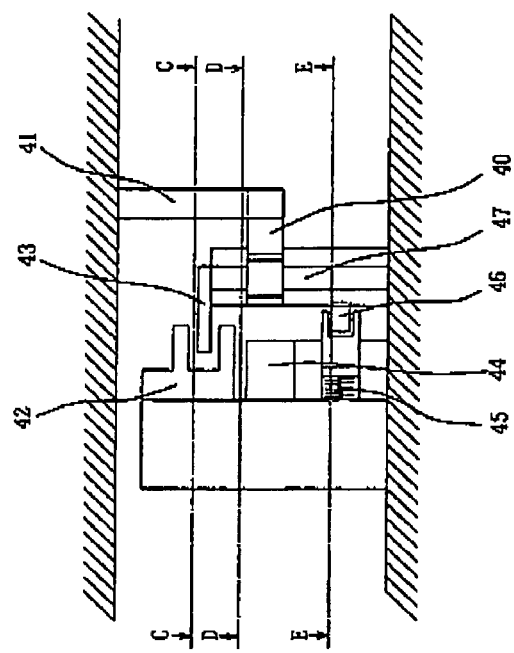
FIG. 7A is a lateral view showing other example of a stopper which can be used instead of the foregoing stopper.
Figure 7B:
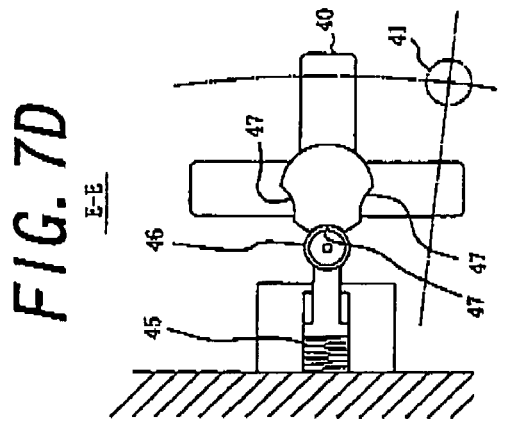
FIGS. 7B, 7C, and 7D are cross sectional views taken along lines C—C, D—D, and E—E of FIG. 7A.
Figure 7C:
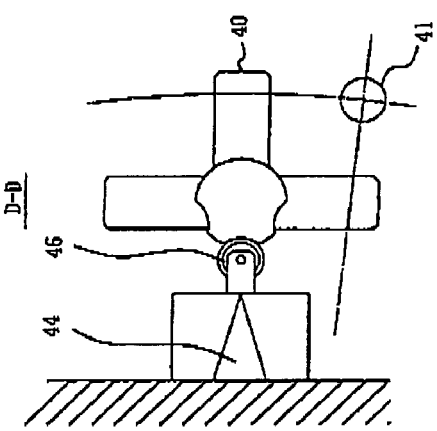
Figure 7D:
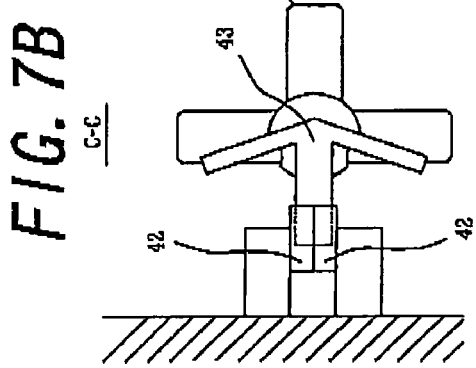
Figure 8A:
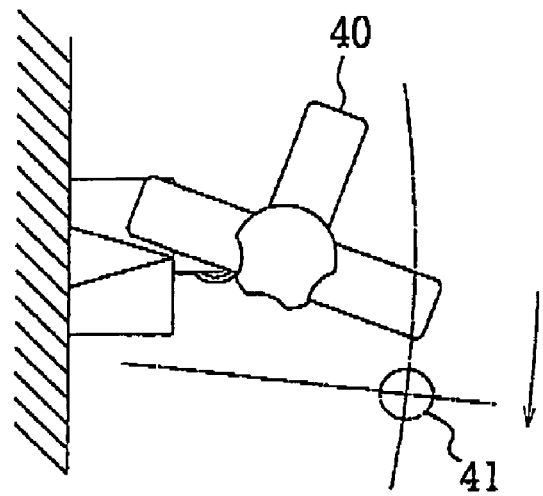
FIGS. 8A, 8B, and 8C are explanation drawings showing operation of the foregoing stopper.
Figure 8B:
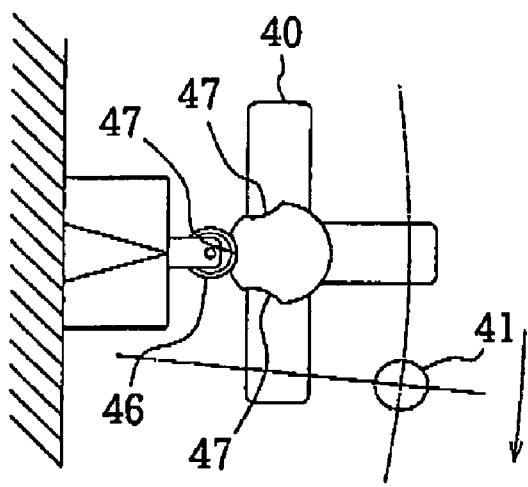
Figure 8C:
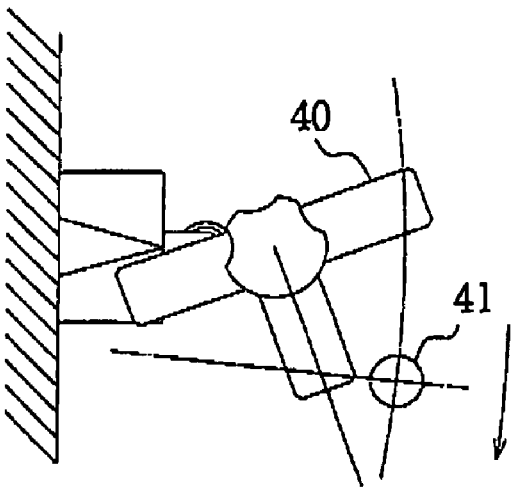

FIG. 7A is a lateral view showing a T-shape stopper which can be used instead of the foregoing L-shape stopper 21*a*. FIGS. 7B, 7C, and 7D are cross sectional views taken along lines C—C, D—D, and E—E of FIG. 7A respectively. FIGS. 8A, 8B, and 8C are explanation drawings showing operation of the T-shape stopper. This stopper stops turning at an angle of slightly less than three revolutions by combination of the T-shape stop member 40 capable of almost half-turn and the stop pin 41 as shown in FIGS. 8A to 8C. A turning position of the stop member 40 can be detected by checking which of the two sensors 42 detects the sensor dog 43.

As shown in FIG. 4, a motor 17*b* to drive the second arm 14*b* through a three-stage reduction transmission structure having a plurality of pulleys 18*b* and the timing belts 19 and a belt transmission structure and an encoder 20*b* to detect the turning angle are fixed under the first arm 14*a*. The first arm 14*a* and the second arm 14*b* are linked by a support shaft of the pulley 18*b* supported turnable by a bearing 25*b*. The motor 17*b* can thereby turn the second arm 14*b* one or more revolutions in relation to the first arm 14*a*. A stopper 21*b* is installed at the support shaft whose shaft center is in a hollow state to let through the wiring 31. This stopper 21*b* limits a turning angle of the second arm 14*b* in relation to the first arm 14*a* to an angle of at most slightly less than two revolutions, and prevents the wiring 31 from over-twisting.

Figure 9A:
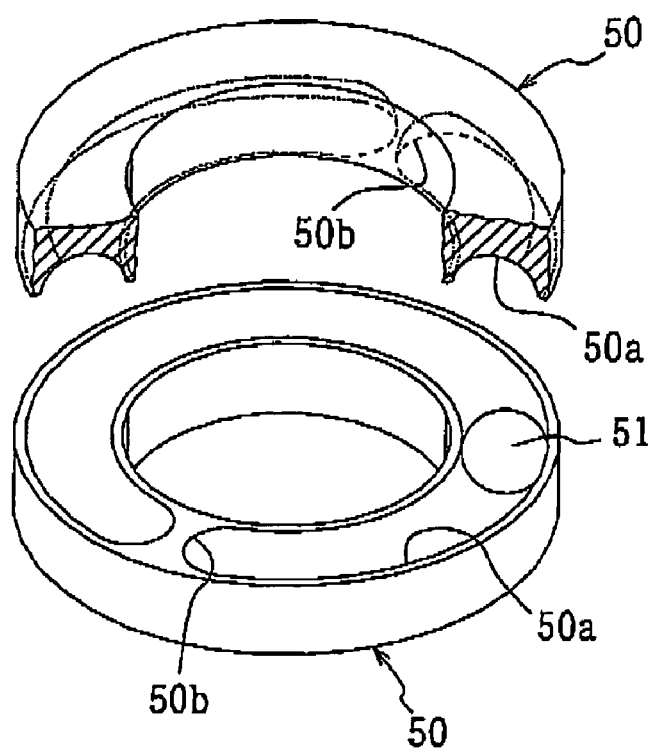
FIG. 9A is a partially cut-off exploded oblique perspective view showing other example of a stopper of the SCARA type robot of the foregoing example.
Figure 9B:
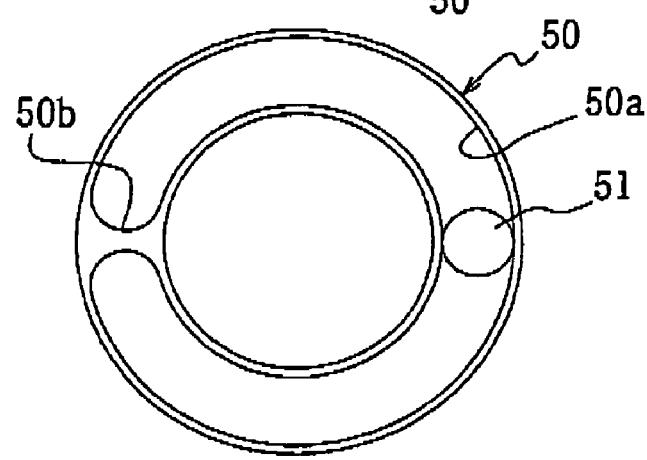
FIG. 9B is a plane view showing one of two ball receiving rings and a ball of the stopper.
Figure 9C:
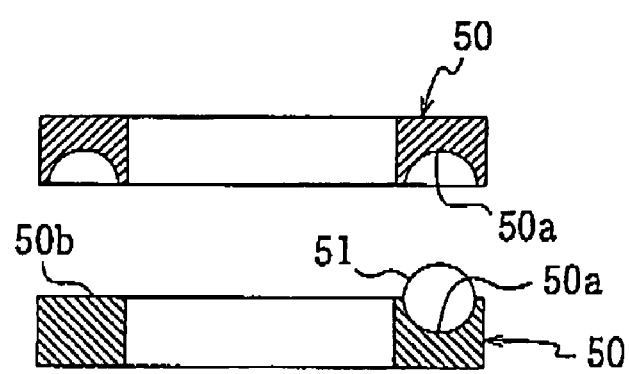
FIG. 9C is a cross sectional view showing the stopper.

FIG. 9A is a segmentary exploded oblique perspective figure showing the foregoing stopper 21*b*. FIG. 9B is a plane view showing one of two ball receiving rings 50 of the stopper 21*b* and a ball 51. FIG. 9C is a cross sectional view showing the stopper 21*b*. In this stopper 21*b*, ball grooves 50*a* with a central focus on the turning axis line are provided on respectively opposed plane faces of the overlapped two ball receiving rings 50. These ball grooves 50*a* comprise one bay 50*b* respectively. The one ball 51 is arranged in the foregoing respectively opposed ball grooves 50*a*. This ball type stopper 21*b* allows relative turning of the two ball receiving rings 50 at an angle of slightly less than two revolutions by rolling of the ball 51 in the ball grooves 50*a*. In addition, this ball type stopper 21*b* stops more turning by contact between the ball 51 and the bay 50*b*, and prevents the foregoing wiring 31 from being twisted and cut.

FIG. 10A is an exploded lateral view showing other ball type stopper which can be used instead of the foregoing stopper 21*b*. FIGS. 10B and 10C are an exploded plane view and an exploded oblique perspective figure showing the ball type stopper. In this stopper, a ball groove 53*a* is provided spirally on a periphery face of a cylindrical ball receiving drum 53 over a given turning angle from one revolution to four revolutions. A glyph-shaped ball groove 52*a* having a length corresponding to a spiral pitch of the foregoing given turning angle of at most four revolutions is provided at a ball receiving bar 52 which is arranged at the inner face of the bearing which contacts with this ball receiving drum 53. The ball 51 is arranged in the two ball grooves. This ball type stopper stops more turning over the foregoing given turning angle of at most four revolutions by contacting the ball 51 whose position is limited by the glyph-shaped ball groove 52*a* and which rolls in the spiral ball groove 53*a* to an end of the spiral ball groove 53*a*. In result, the foregoing wiring 31 is prevented from being twisted and cut. The glyph-shaped ball groove 52*a* can be directly provided at the bearing. In addition, contrary to the foregoing construction, it is possible to provide the spiral groove at the inner face of the bearing, and provide the glyph-shape groove at the outer face of the support shaft.

Further, as shown in FIG. 4, motors 17*c* and 17*c*' to drive two wrist portions 15*a* and 15*b* through two reduction transmission mechanisms having pulleys 18*c* and 18*c*' and timing belts 19*c* and 19*c*' are provided to the inside of the second arm 14*b*. Encoders 20*c* and 20*c* ' are linked to the motors 18*c* and 18*c*' respectively. In this example, no stopper is provided between the second arm 14*b* and each of the wrist portions 15*a* and 15*b* that are capable of making one turn or more in relation to the second arm 14*b*. However, the stopper as shown in the foregoing each figure can be installed as necessary.

The two wrist portions 15a and 15b on which the upper and lower finger portions 16a and 16b are respectively fixed are supported on the second arm 14b turnable by ball bearings 25c on the same tuning axis line as each other. The two wrist portions 15a and 15b are driven by the foregoing two motors 17c and 17c', and turned in relation to the second arm 14b independently from each other.

All the foregoing motors 17a, 17b, 17c, 17c', and 17d as a means to drive the arm unit 14 and the wrist portions 15a and 15b are supplied with driving electric power from a control device 13 in which a general computer is built, which is provided outside the robot 1 as shown in FIG. 4. In addition, the control device 13 conducts feedback control for turning angles by receiving output signals from the encoders 20a, 20b, 20c, 20c', and 20d corresponding to the respective motors. The control device 13 operates the respective motors based on a previously given program to move the upper and lower finger portions 16a and 16b along a desired route.

The wiring 31 between the control device 13 and the respective motors, encoders; and unshown negative pressure piping for suction mouths 26 of the finger portions 16a and 16b are let through the foregoing hollow shaft between the body 12 and the first arm 14a or a hollow shaft between the first arm 14a and the second arm 14b. The wiring 31 and the negative pressure piping is provided with coil-shaped winding wire part etc. in order to address expansion and contraction associated with turning of the arm unit 14. Therefore, an enough length of the wiring 31 and the negative pressure piping is given in the range the stoppers 21a and 21b allow.

Figure 11:
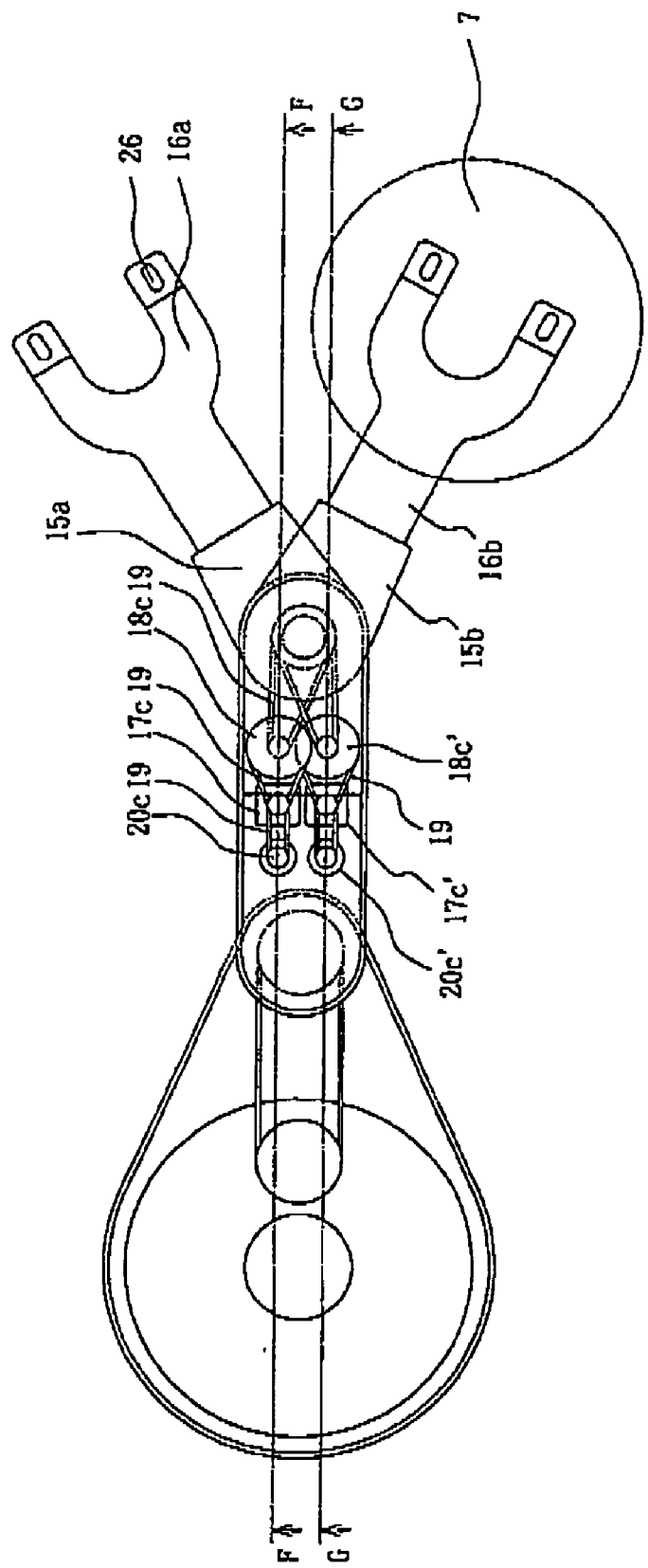
FIG. 11 is a plane layout drawing showing other layout example of driving parts for wrist portions.
Figure 12:
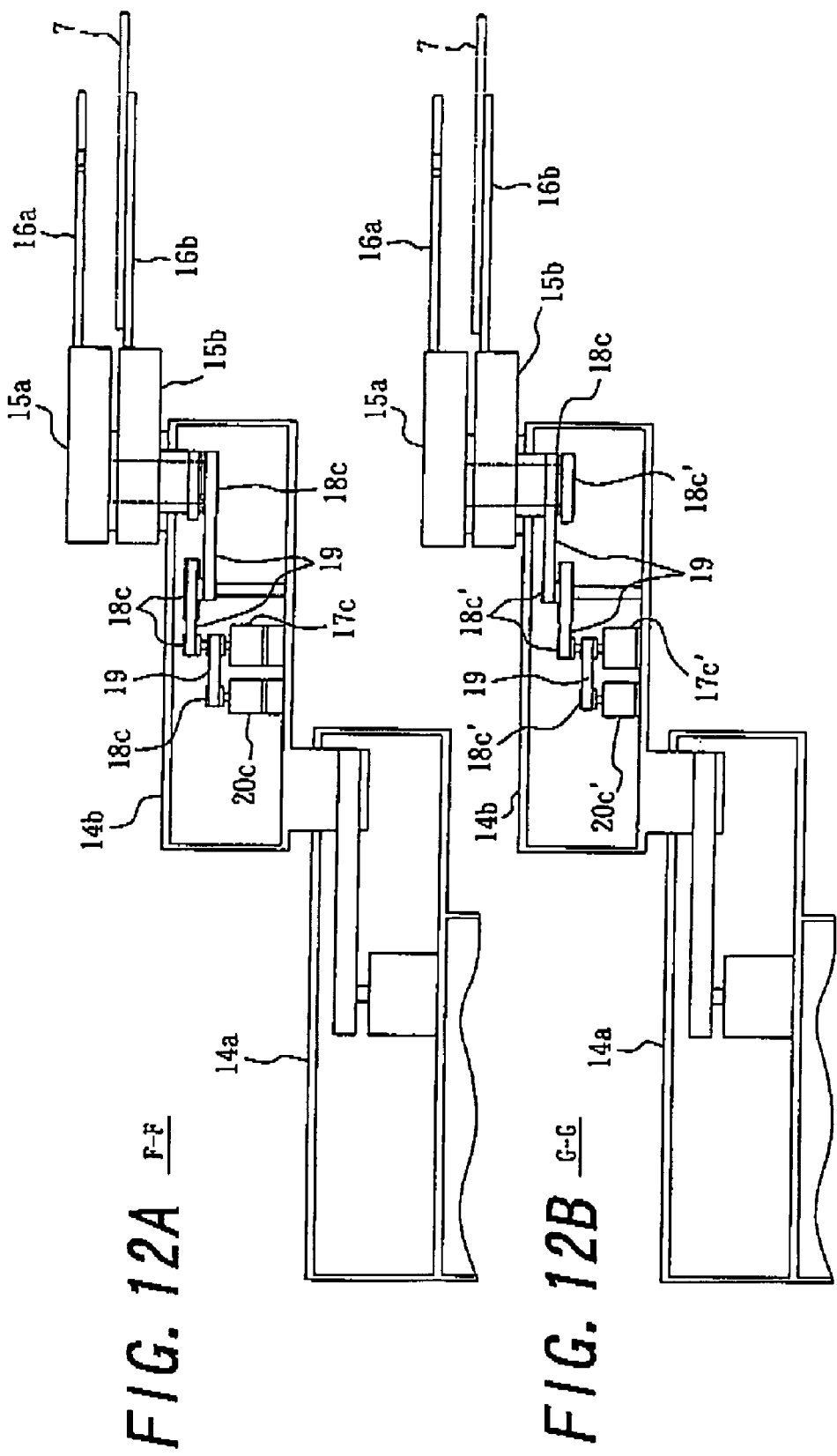
FIGS. 12A and 12B are cross sectional views taken along lines F—F and G—G of FIG. 11.

FIG. 11 is a plane layout drawing showing other layout example of driving parts (driving means) for the wrist portions 15a and 15b. FIGS. 12A and 12B are cross sectional views taken along lines F—F and G—G of FIG. 11 respectively. These figures particularly show in detail layouts of the two motors 17c and 17c' and the two encoders 20c and 20c', which are housed in the central part between both ends of the second arm 14b. That is, in this layout example, the two motors 17c and 17c' and the two encoders 20c and 20c' are arranged side by side in the width direction of the second arm 14b.

Figure 13:
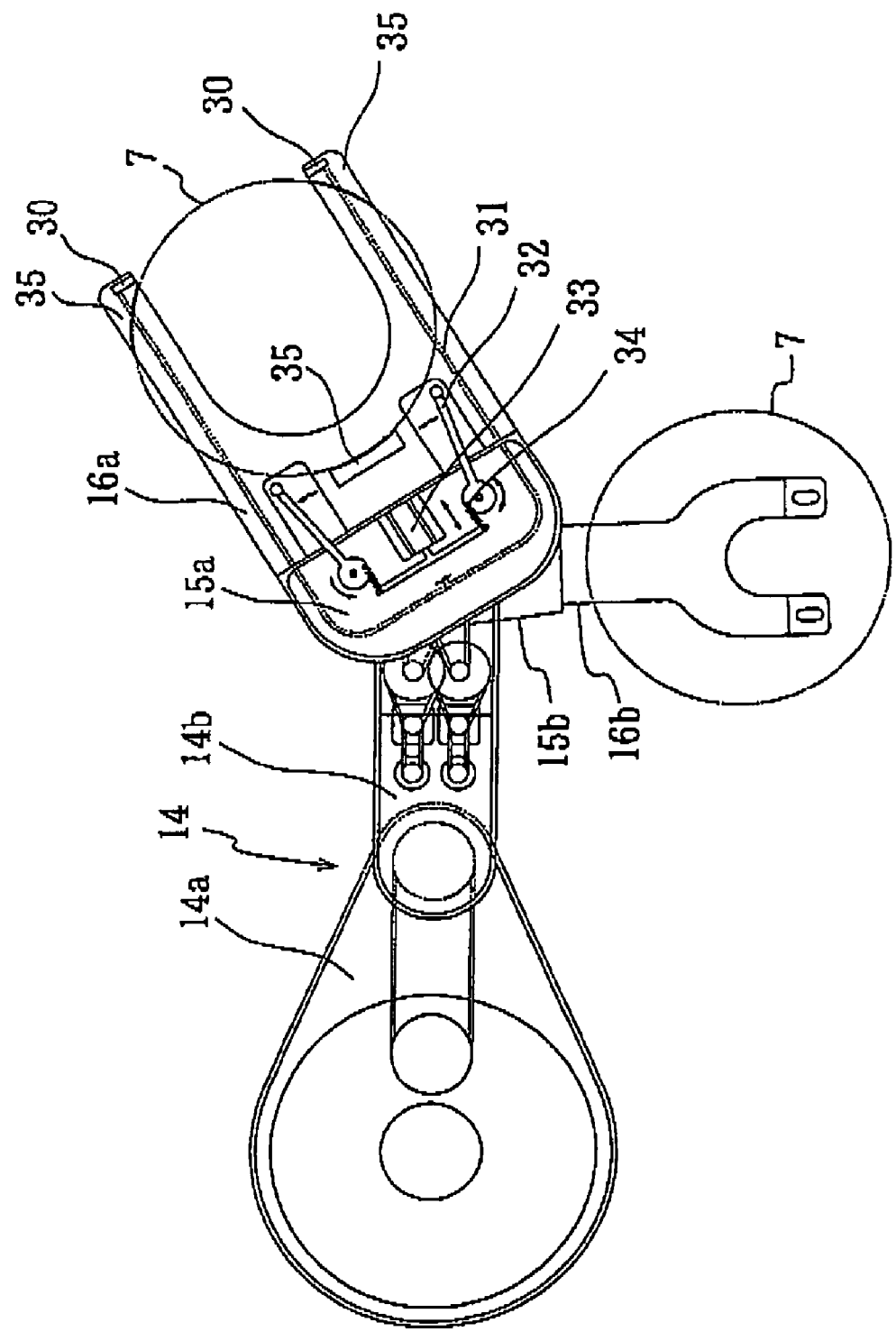
FIG. 13 is a plane layout drawing showing an example of an edge clamp type finger portion of the SCARA type robot of the foregoing example.
Figure 14:
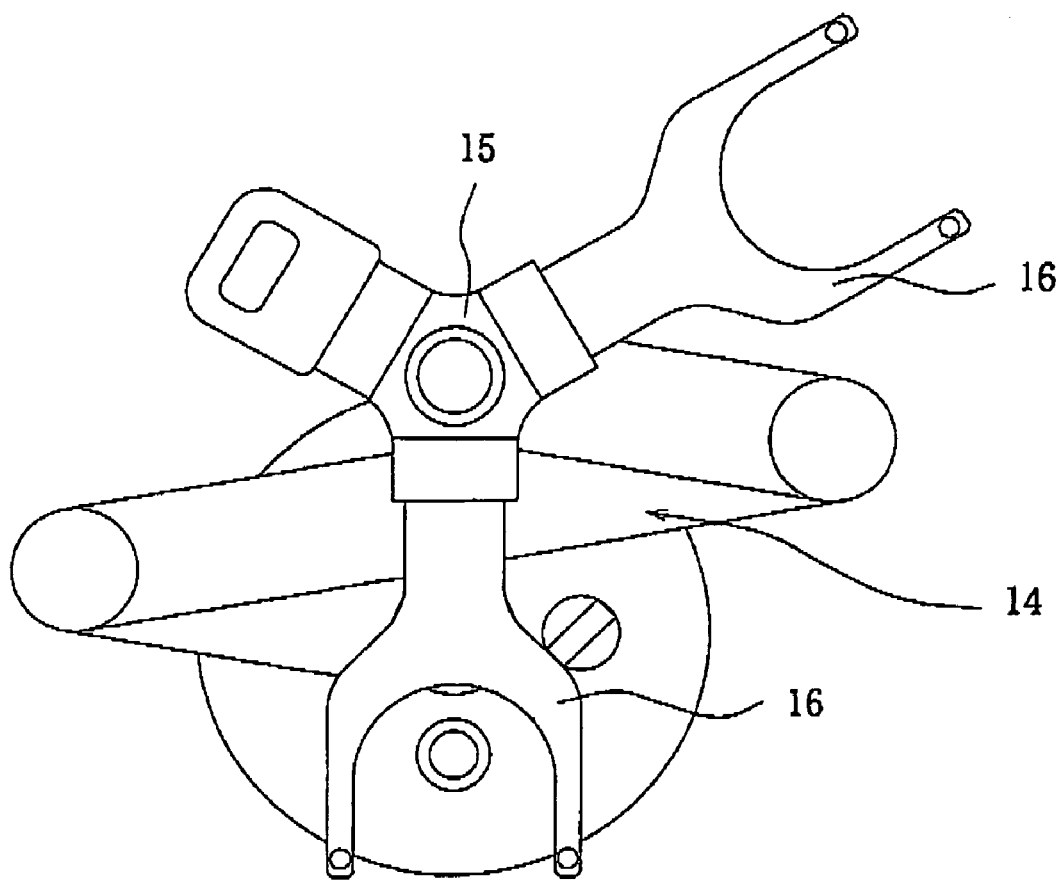
FIG. 14 is a plane view showing a conventional SCARA type robot.

FIG. 13 is a plane layout drawing showing an edge clamp type finger portion, that is, a finger portion having a structure to hold a peripheral part of the wafer 7 without touching a rear face of the wafer 7. In the wrist portion 15a, a pair of wafer edge clamps 32 which are driven by an air cylinder 33 and are linked by springs 34 holds the wafer 7 whose peripheral part is laid on a wafer guide 35 so as to prevent the wafer 7 from sliding. In the shown example, in addition to the one edge clamp type finger portion 16a, one finger portion 16b which contacts the rear face of the wafer 7 as shown in FIGS. 2 and 11 is provided. It is possible that two finger portions are the foregoing edge clamp type fingers.

Further, in FIG. 13, mapping sensors 30 composed of a transmissive optical sensor comprising a projector device and a light receiving device are provided at ends of the two-forked edge clamp type finger 16A. This mapping sensor 30 is, for example, used to confirm presence of the wafer 7 housed in the clean container 3. As the mapping sensor 30, a reflective optical sensor can be used as well. However, a magnetic sensor and a contact type sensor are not preferable since they might give adverse effects on the wafer 7, which is an electronic part.

According to the robot 1 of the foregoing example, by providing the two finger portions 16a and 16b, it becomes possible that two wafers 7 can be carried at once. In addition, according to the robot 1 of the foregoing example, one finger portion can be exclusively used for the wafer 7 before processing, and the other finger portion can be exclusively used for the wafer 7 after processing distinctively. Therefore, it becomes possible to highly prevent movement of foreign objects.

Further, the respective arms 14a and 14b, and the respective finger portions 16a and 16b can be operated independently. Therefore, even in relation to the target instruments lined side by side, the robot 1 is not moved sidewise to the front of these instruments, but the finger portions 16a and 16b can be inserted in the vertical direction in relation to their entrance faces. Therefore, it becomes possible to smoothly carry the tabular object.

Furthermore, the stopper 21a and 21b which can limit turning in the range of a given turning angle of at most four revolutions are installed for two places among the turning parts capable of turning one or more revolutions except for the two wrist portions. Therefore, it becomes possible to securely prevent the wiring 31 to the motors, encoders, optical sensors etc. and the unshown negative pressure piping for the suction mouths 26 which are let through in the body and the arms from being cut when the robot 1 operates accidentally.

Descriptions have been given based on the shown example. However, this invention is not limited to the foregoing example, but can be changed as appropriate in the range of scope of claims. For example, a tabular object other than the wafer can be carried.

INDUSTRIAL APPLICABILITY

According to an SCARA type robot of the invention, a finger portion, which is fixed to a wrist portion and holds a tabular object can be moved in the nearly vertical direction in relation to a front entrance of a target instrument such as a container housing the tabular object, a machine to fabricate, process, inspect the tabular object, and a machine to conduct positioning of the tabular object.

The invention claimed is:

1. An SCARA type robot to carry a tabular object, comprising:
  a base,
  an arm unit configured to have two arms, one end of the arm unit being linked to the base so as to be horizontally pivotable, and the arm unit being capable of horizontally bending and stretching,
  wrist portions which are linked by first pivotable portions to one of said arms at the other end of the arm unit so as to be horizontally pivotable, and to which finger portions to hold a tabular object are fixed, and
  driving means of the arm unit and the wrist portions,
  wherein the driving means can independently turn said first pivotable portions which link the wrist portions and the arm unit, a second pivotable portion which bends and stretches the arm unit, and a third pivotable portion which links the arm unit and the base, so that the finger portions holding the tabular object can be moved along a plurality of nearly straight through routes which are virtually parallel to each other, and can turn at least one of the pivotable portion to make one turn or more,
  the SCARA type robot further comprising stoppers which limit the turn of the pivotable portions capable of making one turn or more to a prescribed pivotable angle after one turn is made, wherein said wrist portions comprise two wrist portions, wherein these wrist portions are pivotable independently from each other, and arranged on the same turning axis line.

2. The SCARA type robot according to claim 1, wherein the driving means for the wrist portions are incorporated in a part between the two end portions of said one of said arms of the arm unit, to which the wrist portions are linked.

3. A system for processing a tabular object, wherein the SCARA type robot according to claims 1 or 2 is arranged adjacent to a place where the tabular object is carried in and out, and to a device for processing the tabular object.

* * * * *